(12) United States Patent
Barak et al.

(10) Patent No.: US 12,360,462 B2
(45) Date of Patent: *Jul. 15, 2025

(54) OPTICAL METROLOGY SYSTEM AND METHOD

(71) Applicant: NOVA LTD., Rehovot (IL)

(72) Inventors: Gilad Barak, Rehovot (IL); Amir Shayari, Rehovot (IL)

(73) Assignee: NOVA LTD., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/403,654

(22) Filed: Jan. 3, 2024

(65) Prior Publication Data
US 2024/0264538 A1    Aug. 8, 2024

Related U.S. Application Data

(63) Continuation of application No. 17/904,950, filed as application No. PCT/IL2021/050212 on Feb. 24, 2021, now Pat. No. 11,868,054.

(60) Provisional application No. 62/980,451, filed on Feb. 24, 2020.

(51) Int. Cl.
*G03F 7/00* (2006.01)
*G01B 9/02* (2022.01)

(52) U.S. Cl.
CPC ..... *G03F 7/70625* (2013.01); *G01B 9/02044* (2013.01)

(58) Field of Classification Search
CPC .................. G03F 7/70625; G01B 9/02044
See application file for complete search history.

(56) References Cited

U.S. PATENT DOCUMENTS

| | | |
|---|---|---|
| 6,552,799 B1 | 4/2003 | Wright et al. |
| 10,161,885 B2 | 12/2018 | Barak et al. |
| 10,737,823 B2 | 8/2020 | Palmer et al. |
| 2006/0256343 A1 | 11/2006 | Choma et al. |

(Continued)

*Primary Examiner* — Mohamed Charioui
*Assistant Examiner* — Lynda Dinh
(74) *Attorney, Agent, or Firm* — Reches Patents (57) ABSTRACT

A measurement system for use in optical metrology, the measurement system which includes a control system configured and operable to carry out the following: (i) receive raw measured data generated by a measurement unit that is configured and operable for performing normal-incidence spectral interferometric measurements on a sample and generating the raw measured data indicative of spectral interferometric signals measured on the sample for a number of different optical path differences (OPDs) between sample and reference arms using infrared wavelengths; (ii) extract, from the raw measured data, a portion of spectral interferometric signals describing variation of signal intensity with a change of an optical path difference OPD during interferometric measurements, said portion of the spectral interferometric signals being independent of interferometric signals returned from a bottom portion of the sample in response to said illuminating electromagnetic field; and (iii) directly determine, from the extracted portion of the spectral interferometric signals, both spectral amplitude and phase of reflection of the illuminating electromagnetic field from the top portion of the sample, thereby enabling to determine a measured spectral signature characterizing the top portion of the sample.

6 Claims, 4 Drawing Sheets

(56) References Cited

U.S. PATENT DOCUMENTS

| | | |
|---|---|---|
| 2009/0303493 A1 | 12/2009 | Colonna de Lega et al. |
| 2010/0265516 A1 | 10/2010 | De Groot et al. |
| 2017/0016835 A1* | 1/2017 | Barak ................ G01B 11/0675 |
| 2018/0372644 A1 | 12/2018 | Barak et al. |
| 2019/0154594 A1 | 5/2019 | Barak et al. |

* cited by examiner

OPTICAL METROLOGY SYSTEM AND METHOD

TECHNOLOGICAL FIELD AND BACKGROUND

The present invention is in the field of optical measurements on patterned structures, such as semiconductor wafers, and is particularly useful for metrology measurements.

Optical measurement methods, which are broadly used for semiconductor metrology and process control, traditionally rely on Spectral Reflectometry and/or Spectral Ellipsometry. However, since electromagnetic field scattered from a structure also contains spectral phase information, which may be highly beneficial in extracting further or more accurate information from the measurements, and direct access of which is not possible at optical frequencies, Spectral Interferometry is used.

Some Spectral Interferometric techniques are described for example in U.S. Pat. Nos. 10,739,277 and 10,161,885, both assigned to the assignee of the present application.

GENERAL DESCRIPTION

There is a need in the art for a novel technique for implementing infrared (IR) based spectral interferometric measurements in patterned structures, enabling to separate out contributions from the structure's back-side based on the limited temporal coherence of the interferometer.

Extending the wavelength range of the scatterometry measurements towards IR range provides multiple benefits, in particular the ability to penetrate materials which are opaque in the Vis-UV range, unique sensitivities (e.g., to material properties), advantages in simulation simplicity, etc. More specifically, when measuring in structures that are partially or fully transparent for some or all of the optical system operating wavelengths (e.g., structures fabricated on (standard) Si wafers), incident light is not absorbed within the structure but rather continues to propagate inside the structure and is partially reflected back from the bottom (back side), and when output through the top portion of the structure, presents a parasitic signal which is to be separated from the top surface reflection. For wavelengths beyond ~1.1 μm, the Si substrate becomes transparent and significant contamination may arise due to reflections from the wafer back-side. Wafer's bottom reflection is not stable due low repeatability/wafer chucking surface.

It is generally desired to use normal-incidence metrology which has several advantages as compared to oblique-incidence operation. Examples of such advantages relate to hardware simplicity (illumination and collection optics are common over significant portion of the optical path), dimensional compactness, allowing integration of the solution into small-footprint implementations (such as integrated metrology) and even simulation simplicity of the light-matter interaction.

However, normal incidence mode using IR illumination unavoidably results in collection of reflections of structure's top portion (desired data) and structure's bottom portion (contamination). When high spectral qualities are needed, as is common for today's metrology requirements, such contamination can detrimentally prevent correct interpretation of the measured data. It is thus desired to avoid or accurately remove this contamination while maintaining other system parameters such as spot size and throughput.

Several approaches are available to mitigate this problem. For example, wafer back-side reflections can be removed via confocal optical layout (implementation of confocal layout allows significant reduction of out-of-focus contributions). However, confocal mode is problematic for scatterometry in that it introduces strong sensitivity to small focus errors. According to algorithmic removal of wafer back-side reflections, the contribution of the signal arising from wafer back-side reflection is estimated and subtracted algorithmically from the measured signal. However, back-side reflections can vary between different locations on the wafer (depending on roughness or even characteristics of the underlying stage holding the wafer), as well as Also, the measured structure (fabricated at the wafer top) affects the signal reflected from the back-side: as changes in this structure affect the overall light transmission through it, one cannot consider the back-side reflection as a 'constant' contribution. Expected spectral errors associated with the back-sire reflections are of order of few percent (or even a fraction of a percent for some optical layouts), which sometimes still allows quantitative interpretation with reasonable errors. However, for high-end scatterometry, tackling advanced applications, such errors are grossly unacceptable, and therefore simple disregard of the back-side contribution cannot be used. Consequently, IR scatterometry for semiconductor metrology is commonly based on oblique-incidence measurements.

The technique of the present invention is based on the novel approach for analyses of raw measured data, indicative of spectral interferometric signals measured on a sample for different optical path differences between the sample and reference arms of the interferometer and utilizing operating wavelengths including wavelength(s) for which the sample is substantially not absorbing. The invention enables to directly extract both the sample's top portion spectral refection and phase, irrespective of whether the raw measured data also includes reflections from sample's interfaces other than the top portion (e.g., bottom portion reflection).

The above is achieved in the invention by extracting, from the raw measured data, interferometric signal portion describing variation of signal intensity with a change of an optical path difference (OPD) between the sample and reference arms, over a few (at least four) different values of the OPD. This portion of the spectral interferometric signals being measured is independent of interferometric signals returned from one or more internal interfaces of the sample, and therefore provides for directly determining from said portion the spectral amplitude and phase of the signal returned from the top portion of the sample. In the description below, such a signal portion describing the intensity (amplitude) variation is at times termed as "AC part of the signal" measured over variation of the optical path difference.

As will be described below, the inventors have found that a so-called "DC part" of the measured signal, i.e., the part which is independent of the OPD is the only signal part relating to reflection from the sample's back-side (or other internal interfaces), while the AC part of the signal alone relates to the top portion reflections. This condition is maintained under assumptions that light field reflections from the interferometric mirror (generally, optical path difference inducing unit), as well as light field reflection from the bottom side (generally internal interfaces of the sample), and light field reflections from the top portion, do not change across the pixel spectral bandwidth, since the spectral bandwidth of a single pixel is commonly very narrow (typically ~1-few nm).

It should be noted that although the present invention is particularly useful for optical metrology of silicon structures (semiconductor wafers), in which normal-incidence measurements using IR spectral range are desired, the principles of the invention are limited to neither the type of samples nor the spectral range of operating wavelengths. The invention is advantageously useful for spectral interferometric measurements on a sample of the type where the sample's top portion response (amplitude and phase) to illumination applied to the top portion is to be determined, while the illumination includes wavelengths which are substantially not absorbed by the sample material.

Thus, according to one broad aspect of the invention, there is provided a measurement system for use in optical metrology measurements, the measurement system comprising a control system configured as a computer system comprising data input utility, memory and a data processor, and being configured for data communication with measured data provider for receiving raw measured data indicative of measured spectral interferometric signals returned from a sample in response to illuminating electromagnetic field incident onto a top portion of the sample and comprising at least one spectral range to which said sample is substantially not absorbing, the data processor comprising an analyzer utility configured and operable to carry out the following:

extract, from the raw measured data, a portion of spectral interferometric signals describing variation of signal intensity with a change of an optical path difference OPD during interferometric measurements, said portion of the spectral interferometric signals being independent of interferometric signals returned from a bottom portion of the sample in response to said illuminating electromagnetic field; and directly determine, from the extracted portion of the spectral interferometric signals, both spectral amplitude and phase of reflection of the illuminating electromagnetic field from the top portion of the sample, thereby enabling to determine a measured spectral signature characterizing the top portion of the sample.

The control system may further include a fitting utility configured and operable to apply model-based processing to the measured spectral signature, to determine one or more parameters of the sample under measurements.

The technique of the invention is essentially useful for monitoring measurements on samples/structures made of silicon material using IR spectrum or a combination of visible and IR spectra.

In some embodiments, the raw measured data includes data indicative of the spectral interferometric signals returned from the top and bottom portions of the sample made of silicon material (and possibly also returned from one or more internal interfaces of the sample) in response to the illuminating electromagnetic field including IR spectrum.

In some embodiments, the measurement system comprises a measurement unit configured as the measured data provider for generating and providing said raw measured data, the measurement unit being configured and operable for performing spectral interferometric measurements on samples using operating wavelengths comprising the at least one spectral range to which the samples are substantially not absorbing.

For example, the spectral interferometric measured signals have a signal intensity profile determined as:

$$I(\lambda_i, z) = |E_{top}(\lambda_i)|^2 + |E_{bot.}(\lambda_i)|^2 + |E_m(\lambda_i)|^2 + 2|E_{top}(\lambda_i)||E_m(\lambda_i)|\cos\left(\frac{2\pi}{\lambda}z + \phi(\lambda_i)\right)$$

wherein: $E_{top}(\lambda_i)$ is the spectral amplitude of the electromagnetic field reflection from the top portion; $E_{bot.}(\lambda_i)$ is the spectral amplitude of the electromagnetic field reflection from the bottom portion of the sample; $E_m(\lambda_i)$ is electromagnetic field reflection from an interferometric mirror; $\lambda_i$ is the operating wavelength; and z in a position of the interferometric mirror; and $\phi(\lambda_i)$ is the spectral phase of the measured spectral interferometric signal.

The signal portion to be extracted is:

$$2|E_{top}(\lambda_i)||E_m(\lambda_i)|\cos\left(\frac{2\pi}{\lambda}z + \phi(\lambda_i)\right)$$

which describes signal intensity variation with a change of the position z of the interferometric mirror, and which is independent of interferometric signals returned from the bottom portion of the sample. This enables direct determination of the spectral amplitude and phase of the electromagnetic field reflection of the top portion.

According to another broad aspect of the present invention, there is provided a method for use in optical metrology measurements, the method comprising:

providing raw measured data indicative of measured spectral interferometric signals returned from a sample in response to illuminating electromagnetic field incident onto a top portion of the sample and comprising at least one spectral range to which said sample is substantially not absorbing, and processing said raw measured data, said processing comprising:

extracting, from the raw measured data, a portion of spectral interferometric signals describing variation of signal intensity with a change of an optical path difference OPD during interferometric measurements, said portion of the spectral interferometric signals being independent of interferometric signals returned from a bottom portion of the sample in response to said illuminating electromagnetic field, and directly determining, from the extracted portion of the spectral interferometric signals, both spectral amplitude and phase of reflection of the illuminating electromagnetic field from the top portion of the sample, thereby determining a measured spectral signature characterizing the top portion of the sample.

According to yet further aspect of the invention, there is provided a measurement system comprising:

a measurement unit configured and operable for performing normal-incidence spectral interferometric measurements on a sample and generating raw measured data indicative of spectral interferometric signals measured on the sample for a number of different optical path differences (OPDs) between sample and reference arms using operating wavelengths comprising the at least one spectral range to which the samples are substantially not absorbing; and a control system configured and operable to carry out the following: extract, from the raw measured data, a portion of spectral interferometric signals describing variation of signal intensity with a change of an optical path difference OPD during interferometric measurements, said portion of the spectral interferometric signals being independent of interferometric signals returned from a bottom portion of the sample in response to said illuminating electromagnetic field; and directly determine, from the extracted portion of the spectral interferometric signals, both spectral amplitude and phase of reflection of the illuminating electromagnetic field from the top portion of the sample, thereby enabling to determine a measured spectral signature characterizing the top portion of the sample.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1:
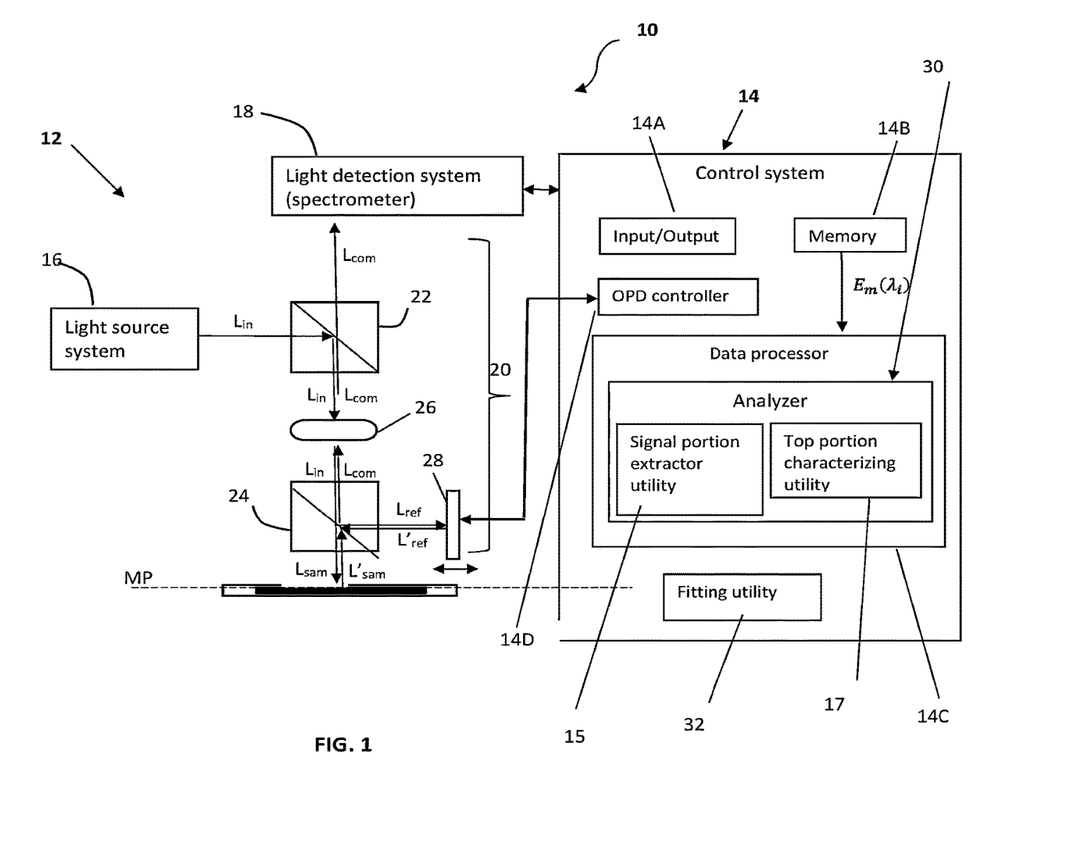
FIG. 1 is a block diagram of a control system of the invention associated with spectral interferometric measurement unit.

Referring to FIG. 1, there is illustrated, by way of a block diagram, a measurement system 10 of the present invention. The system includes a measurement unit 12 and a control system 14.

The measurement unit 12 is configured as a spectral interferometer system operable to measure spectral phase of light returned (reflected and/or scattered) from a structure/sample S (e.g., semiconductor wafer) to enable determination of one or more parameters of the structure (e.g., pattern parameters). The measurement unit 12 may be based on a general spectral reflectometer configuration, where sample reflectivity is accurately measured, and modified for the spectral interferometric measurements.

For the purposes of the present invention, spectral signature of a top portion of the sample is to be measured, using normal incidence measurements applied to the top portion of the sample, and the operating wavelengths include at least one spectral range to which the sample is substantially not absorbing. Accordingly, raw measured data, in addition to effective signals (reflection/scattering of the top portion of the sample), unavoidably includes "parasitic" signal components associated with reflection/scattering of internal interfaces of the sample, e.g., bottom portion of the sample.

The measurement unit 12 thus comprises a normal-incidence interferometer assembly including: a light source system 16 providing broadband input light $L_{in}$ (e.g., including IR spectral range), a detection system 18 (including spectrometer), and a light directing optics 20. The light directing optics 20 includes beam splitters/combiners 22 and 24, objective lens unit 26 (one or more lenses), and optical path difference inducing unit 28 (e.g., interferometric mirror).

The beam splitter/combiner 22 is located in an optical path of the input light beam $L_{in}$ and directs (reflects) the input light $L_{in}$ to propagate towards objective lens unit 26 which focuses the input light $L_{in}$ onto a measurement plane MP where the structure S is located, and directs (transmits) light $L_{com}$ returned from the measurement plane to propagate to the detection system 18. The beam splitter 24 is located between the objective lens unit 26 and the measurement plane MP and is configured to split the input light $L_{in}$ into sample and reference light components $L_{sam}$ and $L_{ref}$ propagating along different optical paths towards, respectively, the measurement plane (sample plane) and the optical path difference inducing unit 28, and to combine reflections of the sample and the mirror 28 into the combined light $L_{com}$ and direct it to the objective lens unit 26, which images this light onto a detection plane where interference pattern is thus created.

The control system 14 is configured as a computer system including inter alia data input/output utilities 14A, memory 14B, and data processor 14C. Also provided in the control system is a controller 14D associated with the mirror 28 for controlling the mirror position and thus a change in the optical path difference between the sample and reference arms. Reflectivity of the mirror 28 with respect to wavelength range of interest, $E_m(\lambda_i)$, can be measured once and stored in the memory 14B.

The data processor 14C is configured and operable for analyzing raw measured data generated by the detection system 18 including data indicative of the measured spectral interferometric signals. According to the invention, the data processor 14C includes an analyzer 30 including a signal portion extractor utility 15 which extracts, from the raw measured data, a portion of spectral interferometric signal describing variation of the signal intensity (amplitude) with a change of a few (at least four) different OPD values, and top portion characterizing utility 17. The latter is configured and operable to utilize the predetermined (once measured) reflectivity of the mirror 28, and directly determine, from the extracted portion of the interferometric signal, both the spectral reflections $E_{top}(\lambda_i)$ and phase $\phi(\lambda_i)$ of the top portion of the sample.

The top portion characterizing utility 17 is further configured to utilize the spectral reflection and phase of the top portion and generate spectral signature characterizing the top portion of the sample.

Also provided in the control system 14C is a fitting utility 32. The fitting utility is configured and operable to apply a model-based processing to the spectral signature of the top portion of the sample, and determine one or more parameters of the sample.

The control system 14 may or may not be integral with the measurement unit 12. Generally, the control system 14 may be a stand-alone system configured for data communication with a measured data provider, which may be the measurement unit 12 itself or a storage device where such measured data is stored.

According to the present invention, both the sample's top portion spectral refection and phase can be directly determined (extracted) from the raw measured spectral interferometric signals, irrespective of whether the raw measured data includes any contamination component associated with reflections of intermediate layers/interfaces in the sample.

The optical path difference inducing element (e.g., interferometer mirror) does not suffer from issues related to reflections from its back side. This can be avoided either by making the mirror 28 from a material opaque in the measured spectral range (in particular IR range, e.g., by using metal or metal-coated mirror), or using the mirror which is thick enough to guarantee loss of temporal coherence between its back side and other reflections in the system. More specifically, the mirror is to be made from material composition different from that of the measured sample (in case of semiconductor wafer—typically Si) and have a different thickness, to eliminate or at least significantly reduce interferometric contribution of coherent reflections from the sample and mirror bottom sides to the measured signal.

The following is the explanation of the principles of the invention. In the description below, the top portion is at times referred to as "top surface".

Considering the interferometric reflectometry case where only top-surface reflection of the sample is detected (as in case of visible wavelengths), the single wavelength k interferometric equation is:

$$I(\lambda) = |E_m + E_w|^2 = |E_m|^2 + |E_w|^2 + 2\sqrt{|E_m^* E_w|} \cos(kz + \phi) \quad (1)$$

wherein:
$E_m$ is the electromagnetic field reflectivity of the mirror 28 ($|E_m|^2$ can be measured when the structure S is outside field of view of the objective lens unit 26);
$E_w$ is the electromagnetic field reflectivity of the sample S ($|E_w|^2$ can be measured when the mirror 28 is in its tilt position in which light reflected from the mirror propagates along an axis not intersecting with the objective lens unit;
$k = 2\pi/\Lambda$
$z$ is the optical path difference between the mirror 28 plane and sample plane MP;

$$\phi = ang\left\{\frac{E_w}{E_m}\right\}$$

is the interferometric phase

Let us now consider the interferometric reflectometry for the spectrometer resolution. Each pixel at the spectrometer sees a finite spectral width. For simplicity, let us consider that each pixel is averaging on the range of $$\left(\lambda_0 - \frac{\Delta\lambda}{2}, \lambda_0 + \frac{\Delta\lambda}{2}\right).$$

The interferometric equation is:

$$I = \Delta\lambda^{-1} \int_{\lambda_0 - \frac{\Delta\lambda}{2}}^{\lambda_0 + \frac{\Delta\lambda}{2}} I(\lambda) d\lambda \quad (2)$$

For the optical path difference (OPD) condition OPD<<$\lambda$, the interferometric equation is:

$$I = |E_m|^2 + |E_w|^2 + 2\sqrt{|E_m^* E_w|} \cos(k_0 z + \phi) \quad (3)$$

and for OPD>>$\lambda$, we have:

$$\int_{\lambda_0 - \frac{\Delta\lambda}{2}}^{\lambda_0 + \frac{\Delta\lambda}{2}} \cos(k_0 z + \phi) \, d\lambda \to 0$$

Thus, generally, in the interferometric reflectometry case where only top-surface reflection of the sample is detected (as in case of visible wavelengths), the electromagnetic field reflection from the sample, $E_w$, can be extracted from the base line or "DC" component of the measured intensity of interferometric signal and the phase data can be extracted from the varying or "AC" component of the measured data. To this end, "reference" measurement of the sample's reflection is performed without mirror contribution, and then several (e.g., four) interferometric measurements are performed while changing the optical path difference (e.g., moving the mirror 28).

The inventors have shown that when operating with a broadband interference spectrum, the "desired" component of the sample's reflection (i.e., top surface reflection) can be extracted from the varying component, being a profile of the measured amplitude varying with the optical path difference in a few interferometric measurements (e.g., at least four such measurements). This technique can be used in visible channel spectral interferometry. However, the advantages of this technique are even more essential when using IR spectrum, in which case this technique allows separation of the contributions from the sample's back-side based on the limited temporal coherence of the interferometer.

The explanations of the techniques of the invention for the IR spectral interferometry are presented below. Here, for simplicity, some assumptions on the reflection properties of the sample and the interferometer mirror are made. It should, however, be understood that the principles of the invention are not reliant on these assumptions, and they are only used to simplify the description.

The temporal coherence of a spectrometer is dictated by its spectral resolution. To this end, let us consider a specific pixel on the spectrometer, which measures the spectral range of $\lambda_i - \delta < \lambda < \lambda_i + \delta$. Here, $\lambda_i$ is the central wavelength read by this pixel and $\delta$ determines its spectral bandwidth.

The measured intensity at pixel for $\lambda_i$ is given by:

$$I(\lambda_i, z) = \frac{1}{2\delta} \int_{\lambda_i - \delta}^{\lambda_i + \delta} I(\lambda) d\lambda.$$

The measured interferometric intensity is defined by interference between the field reflected from the interferometer mirror $E_m(\lambda)$ and from the sample $E_w(\lambda)$.

The material composition of the interferometer mirror is chosen so that its reflectivity has no abrupt spectral changes. As the spectral bandwidth of a single pixel is commonly very narrow (typically ~1-few nm), the mirror reflectivity in this range can be assumed to be constant:

$$E_m(\lambda) \approx E_m(\lambda_i).$$

The sample reflectivity in this spectral range is similarly roughly constant (typical samples also rarely show marked spectral variations within such narrow spectral range), except that it is comprised of two contributions:

$$E_w(\lambda) = E_{top}(\lambda) + E_{bot.}(\lambda)e^{i\frac{2\pi}{\lambda}2nh}.$$

The first term $E_{top}(\lambda)$ relates to reflection from the sample's top. Under the simplifying assumption of (roughly) unchanging reflectivity across the pixel spectral bandwidth, the following condition can be used $E_{top}(\lambda) \approx E_{top}(\lambda_i)$.

The second term $$E_{bot.}(\lambda)e^{i\frac{2\pi}{\lambda}2nh}.$$

relates to reflection from the sample's bottom and includes the bottom reflectivity $E_{bot.}(\lambda)$ and the added phase traveling through the sample, $$e^{i\frac{2\pi}{\lambda}2nh},$$

relating to the phase difference between this term and the top-surface reflection, and the optical path z traversed by light as it passes inside the sample.

Here, 2h is twice the total sample thickness, which is the path taken by light as it goes down to the sample's bottom and back to its top. In practice, light can go through multiple reflections between the two sample's sides, but for simplicity these terms are neglected in the analysis.

Similarly, the following assumption can be made: $E_{bot.}(\lambda) \approx E_{bot.}(\lambda_i)$. It should, however, be noted that the oscillatory term $$e^{i\frac{2\pi}{\lambda}2nh}$$

cannot be assumed to be constant across the spectral range of a pixel, since the factor 2nh can be very large for some type of samples, for example for Si, n~4 and h~700 μm.

The measured intensity is determined by interference of the electromagnetic fields reflected from the sample and mirror. The mirror 28 position z is controllably scanned through several values, to provide several interference spectra from which both reflected phase and amplitude can be derived.

For a specific mirror position z, the intensity for a specific wavelength $\lambda$ is given by the following equation (4):

$$I(\lambda, z) = \left|E_w(\lambda) + E_m(\lambda)e^{i\frac{2\pi}{\lambda}z}\right|^2 = |E_w(\lambda)|^2 + |E_m(\lambda)|^2 + 2\mathcal{R}\left(E_w^*(\lambda)E_m(\lambda)e^{i\frac{2\pi}{\lambda}z}\right)$$

The measured intensity at pixel for $\lambda_i$ is given by:

$$I(\lambda_i, z) = \frac{1}{2\delta}\int_{\lambda_i-\delta}^{\lambda_i+\delta} I(\lambda)d\lambda.$$

Under the assumptions above, this intensity is given by:

$$I(\lambda_i, z) = \frac{1}{2\delta}\int_{\lambda_i-\delta}^{\lambda_i+\delta}\Big[\left|E_{top}(\lambda_i) + E_{bot.}(\lambda_i)e^{i\frac{2\pi}{\lambda}2nh}\right|^2 + \quad (5)$$

$$|E_m(\lambda_i)|^2 + 2\mathcal{R}\left(\left\{E_{top}(\lambda_i) + E_{bot.}(\lambda_i)e^{i\frac{2\pi}{\lambda}2nh}\right\} * E_m(\lambda_i)e^{i\frac{2\pi}{\lambda}z}\right)\Big]d\lambda.$$

Let us now define the following:

$$I_0(\lambda_i) \equiv |E_{top}(\lambda_i)|^2 + |E_{bot.}(\lambda_i)|^2 + |E_m(\lambda_i)|^2 \quad (6)$$

representing the signal contribution, which is independent of the mirror position z and relates to reflection from the sample's back-side $E_{bot.}$.

Hence, unlike measurements using UV-VIS spectra, when operating with IR spectrum one cannot use the DC part, $I_0(\lambda_i)$, of the measured signal cannot be used to extract the top surface reflection $E_{top}$, because it is coupled with $E_{bot.}$.

$$I_T(\lambda_i, z) \equiv 2\mathcal{R}\left((E_{top}(\lambda_i)) * E_m(\lambda_i)e^{i\frac{2\pi}{\lambda}z}\right) \quad (7)$$

relating to interference between the light reflected from the mirror and the light reflected from the sample's top, which is the actual structure under interferometric measurements (i.e., desired component).

The above expression (7) can be written differently:

$$I_T(\lambda_i) \equiv 2|E_{top}(\lambda_i)||E_m(\lambda_i)|\cos\left(\frac{2\pi}{\lambda}z + \phi(\lambda_i)\right) \quad (8)$$

Here, $\phi(\lambda_i)$ is the spectral phase between electromagnetic field reflections from the mirror and sample's top. The measured properties by the spectral interferometer include $|E_{top}(\lambda_i)|$ and $\phi(\lambda_i)$.

$$I_B(\lambda_i, z) \equiv \mathcal{R}\left[\left(E_{top}(\lambda_i) + E_m(\lambda_i)e^{i\frac{2\pi}{\lambda}z}\right) * E_{bot.}(\lambda_i)\frac{1}{\delta}\int_{\lambda_i-\delta}^{\lambda_i+\delta}e^{i\frac{2\pi}{\lambda}2nh}d\lambda\right] \quad (9)$$

relating to interference between reflections from the sample's bottom side and the mirror.

It should be noted that the mirror position (z) is typically of order of the measured wavelengths, as it is used in order to measure the influence of varying the phase between sample and mirror. It is thus of typical values of hundreds of nm or few microns at most, and in any case it is significantly smaller than the optical path length represented by reflections from the sample's back side, i.e., 2nh.

The term $$\left|\frac{d\left(\frac{2\pi}{\lambda}\right)}{d\lambda}\bigg|_{\lambda_i} * 2\delta * z\right| = \left|\frac{2\pi}{\lambda_i^2} * 2\delta * z\right| \ll 1.$$

can be extracted out of the integral. Indeed, $$e^{i\frac{2\pi}{\lambda}z}$$

Rearranging $$z \ll \frac{\lambda_i^2}{\delta}$$

means that along the integration the value of $$e^{i\frac{2\pi}{\lambda}z}$$

almost does not change, therefore can be extracted out of the integral.

The integral term in $I_B(\lambda_i)$ is related to temporal decoherence and reflects the fact that the interference from the sample's back side creates a highly-oscillatory signal, which averages out on the pixel.

Specifically, for n~4, h~700 µm and a typical spectral response of spectrometer pixel (e.g., spectral bandwidth of (5-1 nm) and measured wavelength of ~2000 nm, this term represents an attenuation of order<$10^{-10}$ of the signal, effectively completely removing this contribution from the measurement.

Thus, the spectral interferometric measured signal can be expressed as:

$$I(\lambda_i, z) = I_0(\lambda_i) + 2|E_{top}(\lambda_i)||E_m(\lambda_i)| \cos\left(\frac{2\pi}{\lambda}z + \phi(\lambda_i)\right). \quad (10)$$

Here, the term $I_0(\lambda_i)$ includes some influence of reflections from the sample's back side, but is independent of the interferometer mirror position z. $|E_{top}(\lambda_i)|$ and $\phi(\lambda_i)$ are the reflected field amplitude and phase, which are the measurable properties by the spectral interferometric unit, and $|E_m(\lambda_i)|$ is the mirror reflectivity, and z is the mirror position.

It is thus shown that while the z-independent term, $I_0(\lambda_i)$, is affected by reflections from the sample's back side, there are no such effects on the z-dependent term, $$2|E_{top}(\lambda_i)||E_m(\lambda_i)| \cos\left(\frac{2\pi}{\lambda}z + \phi(\lambda_i)\right).$$

Hence, according to the invention, the required top-surface reflection, $E_{top}(\lambda_i)$, is extracted from the z-dependent (OPD dependent) measured intensity profile.

Figure 2:
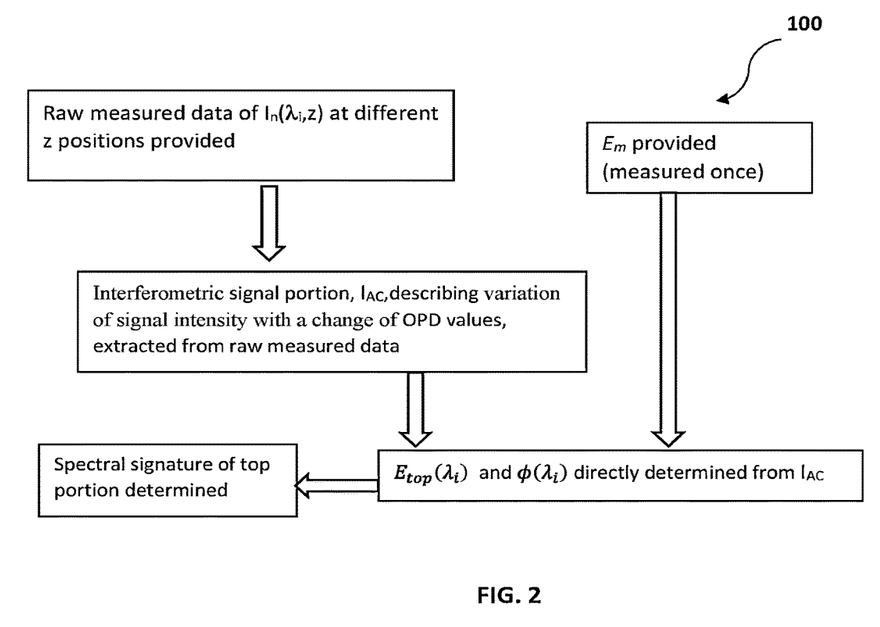
FIG. 2 is a flow diagram of a flow diagram of a method of the invention for use in data interpretation of spectral interferometric data for direct extraction of amplitude and phase of the sample's response to illumination.
Figure 3:
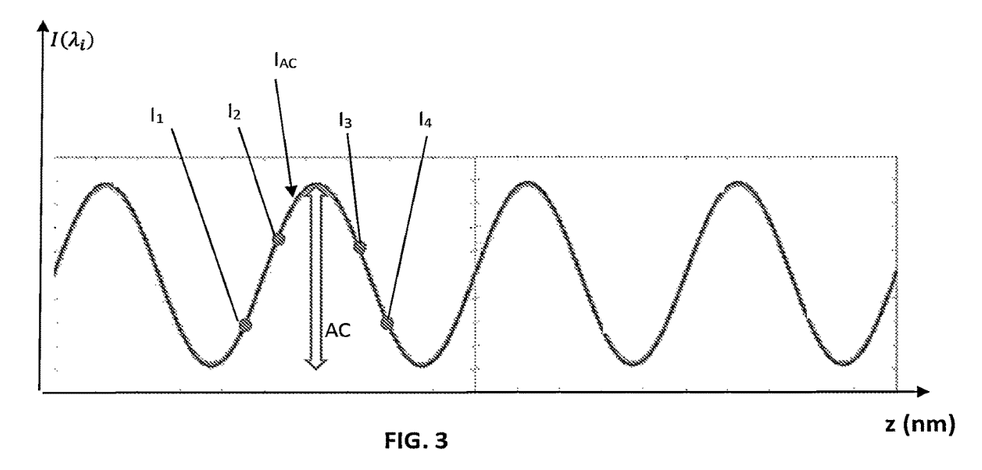
FIGS. 3 and 4 exemplify the principles underlying the invention.
Figure 4:
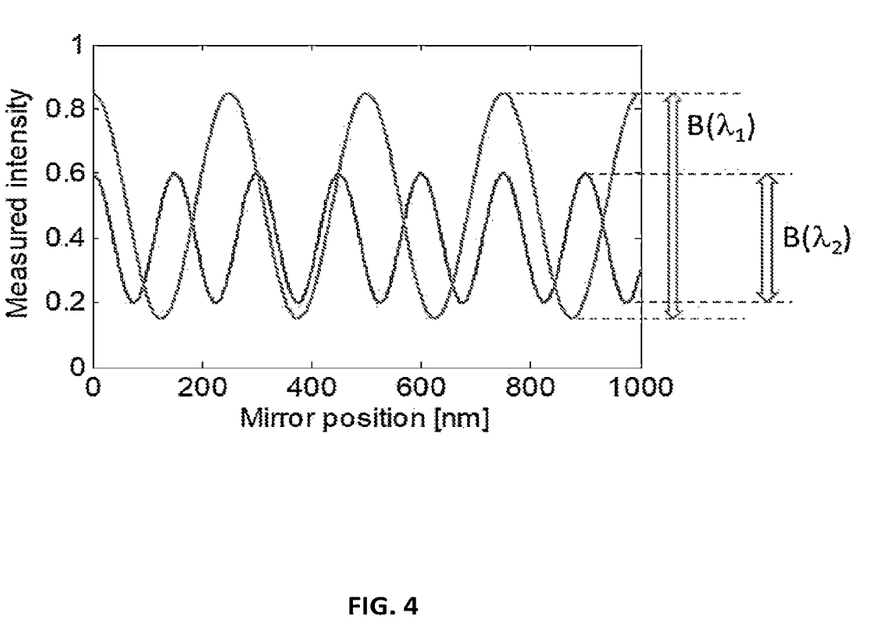

Reference is made to FIGS. 2, 3 and 4 exemplifying the measurement scheme according to the present invention. As shown in a flow diagram 100 of the method of the invention in FIG. 2, measured data is provided, including once-measured mirror reflectivity $E_m(\lambda_i)$, and several measurements of $I(\lambda_i, z)$ taken at varying mirror positions z.

FIG. 3 illustrates the variation of the measured intensity $I(\lambda_i)$ with the change of mirror position z. This graph has an AC component, $I_{AC}$, i.e., the intensity variation profile during z scan. FIG. 4 exemplifies similar spectral measurements for two wavelengths $\lambda_i$ and $\lambda_2$ (e.g., of the IR spectrum).

According to the technique of the present invention, this portion of the raw measured data (i.e., interferometric signal portion describing intensity/amplitude variation with a change of the OPD values) is extracted and used to directly determine the spectral reflection and phase of the sample's top portion. To this end, four or more measurements, $I_1$-$I_4$, with different optical path difference values (z values) may be performed.

As described above (equation (10) above), the only part of the spectral interferometric measured signal, which is related to the sample's bottom reflection, is the z-independent term. Hence, both the sample's top reflectivity $E_{top}(\lambda_i)$ and phase $\phi(\lambda_i)$ can be extracted from the amplitude-varying signal part alone, i.e., intensity profile of the signal measured over z variation. Disregarding the intensity mean in the measured data interpretation completely removes any contribution related to the (incoherent) sample's back-side reflection.

Equation (10) can be expressed as follows:

$$I(\lambda_i, z) = A + B \cos\left(\frac{2\pi}{\lambda}z + C\right) \quad (11)$$

wherein A is the z-independent constant (i.e. the term $I_0(\lambda_i)$) including some influence of reflections from the sample's back side, but independent of the interferometer mirror position z); and parameter B (i.e., $2|E_{top}(\lambda_i)||E_m(\lambda_i)|$) and parameter C $$C\left(\text{i.e., } \cos\left(\frac{2\pi}{\lambda}z + \phi(\lambda_i)\right)\right),$$

can be used for interpretation of the measured data, completely disregarding the constant A.

For example, the spectral amplitude and phase can be determined as:

$$|E_{top}(\lambda_i)| = \frac{B}{2|E_m(\lambda_i)|}; \quad \phi(\lambda_i) = C,$$

Turning back to FIG. 1, the control system 14 receives, e.g., from the spectral interferometric measurement unit 12, raw measured data indicative of the spectral interferometric signals measured for at least 4 different values of the optical path difference between the sample and reference arms, e.g., different z positions of the mirror 28. The data processor 14C (its analyzer 30) operates to extract from the raw measured data the interferometric signal portion of the amplitude varying over varying z values, and directly determine from this signal portion both the top surface reflection $E_{top}(\lambda_i)$ and phase $\phi(\lambda_i)$.

It should be understood that the present invention, although being suitable for use with any spectral interferometric system to directly filter out from data analysis the reflection components from samples' interfaces other than the top portion, is particularly useful for interpretation of IR measurements, which otherwise does not allow direct extraction of the top portion response.

Figure 5:
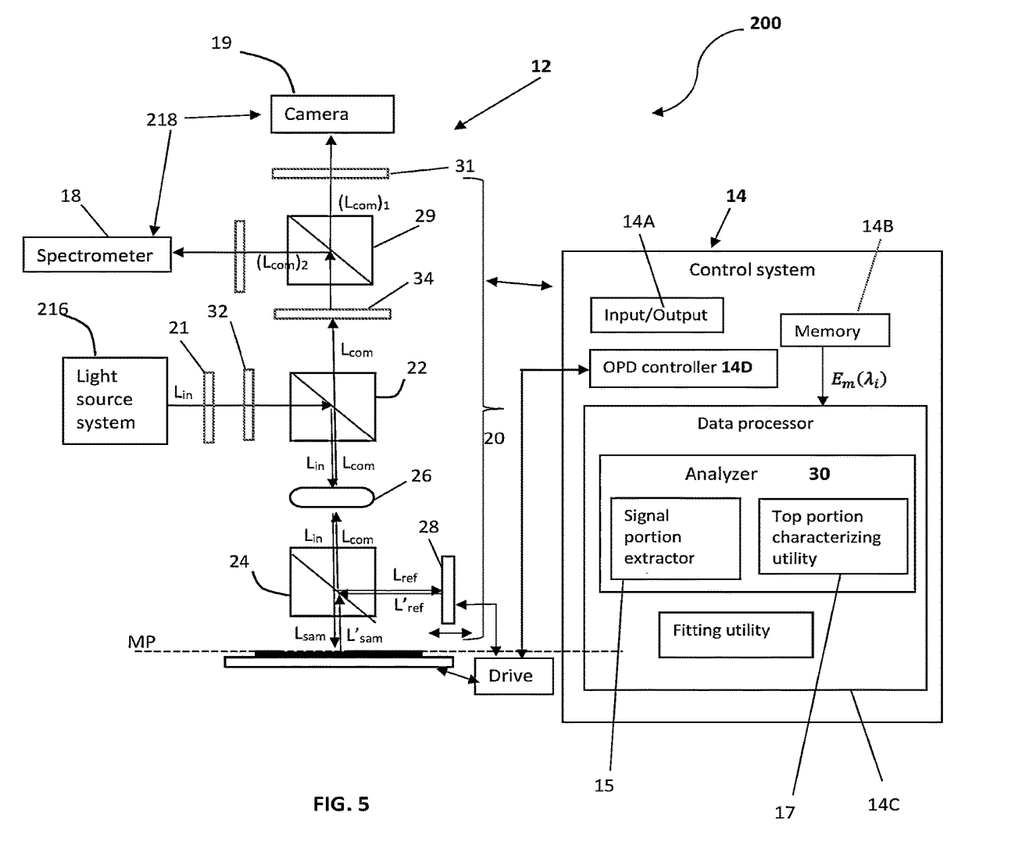
FIG. 5 is a specific example of a measurement system of the present invention.

Reference is made to FIG. 5 schematically illustrating a specific but not limiting example of a measurement system 200 utilizing the present invention. System 200 is configured generally similar to the above-described system 10 of FIG. 1, namely includes a spectral interferometric measurement 12 unit and a control system 14. The same reference numbers are used for indicating system components which are common in both examples.

System 200 includes a light source system 216 which in the present example provides broadband input light in both visual and IR spectra; a detection system 218 which in the present example includes a spectrometer (spectrophotometer) 18 for generating spectral data of light incident thereon, and also includes an imaging detector 19 for navigating to measurement sites on the structure and/or collecting interferometric fringes pattern; and an optical system 220 configured as light directing arrangement for directing light from the light source 216 towards a sample/structure S under measurements located on a sample's support and towards an optical path difference inducing mechanism 28 (e.g. planar reference mirror in this non-limiting example) and directing returned light to the detection system 216. Output of the detection unit 216 is communicated (via wires or wireless signal communication) to a control system 14.

The optical system 20 is configured for defining an illumination channel for propagating input light $L_{in}$ from the light source 216 towards the measurement plane MP (structure plane), and a detection channel for propagating light being measured Lcom to the detection system 218. The input light $L_{in}$ is directed (reflected) by beam splitter/combiner 22 towards objective lens unit 26 which directs this light to a beam splitter/combiner 24, which splits the input light $L_{in}$ into sample and reference beams $L_{sam}$ and $L_{ref}$. These light beams $L_{sam}$ and $L_{ref}$ interact with, respectively, the sample S and the optical path difference inducing unit 28, and respective reflections (scatterings) $L'_{sam}$ and $L'_{ref}$ are combined by splitter/combiner 24 into a combined light beam $L_{com}$. The latter is directed by the lens unit 26 and beam splitter/combiner 22 towards the detection units 18 and 19 of the detection system 218. To this end, the optical system 20 also includes a beam splitter/combiner 29 which divides the returned light beam $L_{com}$ into light portions $(L_{com})_1$ and $(L_{com})_2$ which are directed to, respectively, the imaging detector 19 and spectral sensor (spectrometer) 18.

In the present not limiting example, the light directing arrangement 20 also optionally includes a collimating lens 21 in the illumination channel, being in the optical path of input light $L_{in}$ propagating from the light source 216 towards the beam splitter/combiner 22, and a tube lens 23 in the detection channel, being in the optical path of measured light propagating to the detection unit 18.

Further, in this not limiting example, the optical system 20 include polarizers 32 and 34 located in respectively, illumination and detection channels. More specifically, input light $L_{in}$ on its way from the light source 216 passes through the polarizer 32 and a specifically polarized (e.g., linearly polarized) input light is directed by beam splitter/combiner 22 to objective 26 which directs it to beam splitter/combiner 24. The latter splits polarized input light into sample and reference polarized beams $L_{sam}$ and $L_{ref}$ and directs them to respectively the structure S and reference mirror 28. Reflections from the structure and mirror are combined by beam splitter/combiner 24 into a combined light beam $L_{com}$ having said specific polarization, which passes through the objective 26 and beam splitter/combiner 24 to the polarizer 34, which allows only light of said specific polarization to propagate to the detection system. This combined polarized light beam is divided by beam splitter 29 into light portions $(L_{com})_1$ and $(L_{com})_2$ which are directed to, respectively, the imaging detector 19 and spectrometer 18. The spectrometer 18 measures every wavelength's intensity separately and accordingly measured data generated by the spectrometer corresponds to the spectral interference pattern (which could be detected also by image detector 19).

The system 200 also includes a driving unit 33 associated with either one or both of the mirror 28 and the sample's support for controllably moving it/them along the optical axis, i.e. z-axis, thereby inducing optical path difference resulting in time variation of the spectral interference pattern. It should be noted, although not specifically shown in FIG. 1, that measurement unit 12 of FIG. 1 may also include a similar driving unit.

It should be understood that using polarizers 32 and 34 accommodated and oriented as described above actually provides a cross-polarization scheme, which results in a dark-field measurement mode. It should also be understood, that when the mirror 28 is not used (i.e., is moved out of the optical path of incident light or is inactivated by the use of an appropriate shutter), the measurement unit 12 can operates as a spectral reflectometer. Accordingly, the same measurement unit 12 may be shifted between two different operational modes, as a spectral interferometer and spectral reflectometer.

The control system 14 is typically a computer system configured and operable as described above with reference to FIGS. 1 and 2.

It should be noted with regard to both examples of FIGS. 1 and 5, that while in these examples the refractive optics is illustrated, partially or fully reflective optics (mirrors based) could be used. In case of wide range IR, the reflective optics could be preferable.

We claim:

1. A measurement system for use in optical metrology, the measurement system comprising:
 a measurement unit that is configured to perform normal-incidence spectral interferometric measurements on a sample for a number of different optical path differences (OPDs) between a sample arm and a reference arm to provide raw measurement, wherein the performing of the normal-incidence spectral interferometric measurements comprises illuminating the sample with infrared radiation having an illuminating electromagnetic field;
 a control system configured and operable to carry out the following:
 (i) receive the raw measured data;
 (ii) extract, from the raw measured data, a portion of spectral interferometric signals describing variation of signal intensity with a change of an OPD during the interferometric measurements that provides at least four different OPD values, said portion of the spectral interferometric signals being independent of interferometric signals returned from a bottom portion of the sample in response to said illuminating electromagnetic field; and
 (iii) directly determine, from the extracted portion of the spectral interferometric signals, both spectral amplitude and phase of reflection of the illuminating electromagnetic field from a top portion of the sample, (iv) determine a measured spectral signature characterizing the top portion of the sample; and
 applying, by a fitting utility, model-based processing to the measured spectral signature to determine one or more parameters of the sample.

2. The measurement system according to claim 1, wherein the control system is further configured to directly determine the both spectral amplitude and phase of reflection of the illuminating electromagnetic field from the top portion of the sample, irrespective of whether the raw measured data also includes reflections from interfaces of the sample other than the top portion.

3. The measurement system according to claim 1, wherein measurement unit is configured to illuminate the sample, during the normal-incidence spectral interferometric measurements, with a combination of visible spectra and the infrared radiation having the illuminating electromagnetic field.

4. A method for use in optical metrology, the method comprising:

performing, by a measurement unit, normal-incidence spectral interferometric measurements on a sample for a number of different optical path differences (OPDs) between a sample arm and a reference arm to provide raw measurement, wherein the performing of the normal-incidence spectral interferometric measurements comprises illuminating the sample with infrared radiation having an illuminating electromagnetic field;

receiving, by a control system, the raw measured data;

extracting, from the raw measured data, a portion of spectral interferometric signals describing variation of signal intensity with a change of an OPD during the interferometric measurements that provides at least four different OPD values, said portion of the spectral interferometric signals being independent of interferometric signals returned from a bottom portion of the sample in response to said illuminating electromagnetic field;

directly determining, from the extracted portion of the spectral interferometric signals, both spectral amplitude and phase of reflection of the illuminating electromagnetic field from a top portion of the sample, determining a measured spectral signature characterizing the top portion of the sample; and applying, by a fitting utility, model-based processing to the measured spectral signature to determine one or more parameters of the sample.

5. The method according to claim 4, wherein the directly determining is executed irrespective of whether the raw measured data also includes reflections from interfaces of the sample other than the top portion.

6. The method according to claim 4, wherein the performing of the normal-incidence spectral interferometric measurements comprises illuminating the sample with a combination of visible spectra and the infrared radiation having the illuminating electromagnetic field.

* * * * *